(12) United States Patent
Zou et al.

(10) Patent No.: US 10,283,034 B2
(45) Date of Patent: May 7, 2019

(54) PIXEL STRUCTURE, DISPLAY PANEL, DISPLAY DEVICE, AND DISPLAY-PANEL DRIVING METHOD THEREOF

(71) Applicant: Shanghai Tianma AM-OLED Co., Ltd., Shanghai (CN)

(72) Inventors: Yun Zou, Shanghai (CN); Yang Yang, Shanghai (CN); Xiurui Hu, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 15/864,280

(22) Filed: Jan. 8, 2018

(65) Prior Publication Data

US 2018/0130396 A1   May 10, 2018

(30) Foreign Application Priority Data

Oct. 20, 2017   (CN) .......................... 2017 1 0998587

(51) Int. Cl.
  *G09G 3/20*   (2006.01)
  *G09G 3/3275*   (2016.01)
  (Continued)

(52) U.S. Cl.
  CPC ......... *G09G 3/2003* (2013.01); *G09G 3/3208* (2013.01); *G09G 3/3275* (2013.01);
  (Continued)

(58) Field of Classification Search
  CPC .. G09G 3/2003; G09G 3/3208; G09G 3/3275; G09G 2300/0426;
  (Continued)

(56) References Cited

U.S. PATENT DOCUMENTS

| 5,606,437 A | 2/1997 | Mosier |
| 2008/0001536 A1* | 1/2008 | Tsai .................... H01L 27/3216 |
| | | 313/506 |

(Continued)

FOREIGN PATENT DOCUMENTS

| CN | 103208507 A | 7/2013 |
| CN | 203085546 U | 7/2013 |
| CN | 104332486 A | 2/2015 |
| CN | 204257652 U | 4/2015 |
| CN | 104732928 A | 6/2015 |
| CN | 205231065 U | 5/2016 |

(Continued)

*Primary Examiner* — Md Saiful A Siddiqui
(74) *Attorney, Agent, or Firm* — Anova Law Group, PLLC

(57) ABSTRACT

The present disclosure provides a pixel structure including a plurality of pixel cells arranged into a plurality of rows. Each row includes a plurality of pixel-cell groups, each including a predetermined number of subpixels with different colors arranged along the row direction. The pixel-cell groups are arranged in a zigzag manner along a column direction. For any two neighboring rows, each subpixel in one row is divided into two secondary subpixels along the row direction, and each subpixel in the other row is divided into two secondary subpixels along the column direction. The colors of the subpixels in each pixel-cell group of the odd-numbered rows include a first color, a second color, and a third color, respectively along the row direction. The colors of the subpixels in each pixel-cell group of the even-numbered rows are the second color, the third color, and the first color, respectively along the row direction.

15 Claims, 12 Drawing Sheets

(51) Int. Cl.
*H01L 27/32* (2006.01)
*G09G 3/3208* (2016.01)

(52) U.S. Cl.
CPC ...... *H01L 27/3218* (2013.01); *H01L 27/3276* (2013.01); *G09G 2300/0426* (2013.01); *G09G 2300/0452* (2013.01); *G09G 2310/027* (2013.01); *G09G 2320/0626* (2013.01); *G09G 2320/0666* (2013.01); *G09G 2360/16* (2013.01)

(58) Field of Classification Search
CPC ..... G09G 2300/0452; G09G 2310/027; G09G 2320/0626; G09G 2320/0666; G09G 2360/16
See application file for complete search history.

(56) References Cited

U.S. PATENT DOCUMENTS

| | | | |
|---|---|---|---|
| 2011/0291550 A1* | 12/2011 | Kim | G09G 3/2003 |
| | | | 313/504 |
| 2014/0197396 A1* | 7/2014 | Madigan | H01L 51/0005 |
| | | | 257/40 |
| 2014/0292622 A1 | 10/2014 | Lee | |
| 2016/0155776 A1* | 6/2016 | Kabe | H01L 27/3216 |
| | | | 257/89 |

FOREIGN PATENT DOCUMENTS

| | | |
|---|---|---|
| CN | 106129095 A | 11/2016 |
| CN | 106298833 A | 1/2017 |

* cited by examiner

PIXEL STRUCTURE, DISPLAY PANEL, DISPLAY DEVICE, AND DISPLAY-PANEL DRIVING METHOD THEREOF

CROSS-REFERENCES TO RELATED APPLICATIONS

This application claims the priority of Chinese patent application No. 201710998587.3, filed on Oct. 20, 2017, the entirety of which is incorporated herein by reference.

FIELD OF THE DISCLOSURE

The present disclosure generally relates to the field of display technology and, more particularly, relates to a pixel structure, a display panel, a display device, and a display-panel driving method thereof.

BACKGROUND

Organic light emitting diode (OLED) display device is one of the hot topics in the current research field of flat panel displays. Compared to the liquid crystal display (LCD) devices, the OLED display devices demonstrate many advantages including low energy consumption, low production cost, self-illumination, wide view angle, fast response speed, etc. Currently, the OLED display devices have being used to replace the traditional LCD displays in various applications of flat panel displays, such as mobile phones, personal digital assistants (PDAs), digital cameras, etc.

An OLED includes a plurality of pixels, and each pixel is usually formed by three subpixels, namely, a red (R) subpixel, a green (G) subpixel, and a blue (B) subpixel. Such an arrangement of the pixels is generally referred to as an RGB pixel arrangement structure. When the pixel of the display panel needs to display a certain color, by adjusting the gray-scale value for each of the R, the G, and the B subpixels, the three subpixels may work together to display a desired color. However, the traditional RGB pixel arrangement structure may not meet the requirements of electronic devices on high-resolution displays.

The disclosed pixel structures, display panels, display devices, and driving methods for the display panels are directed to solve one or more problems set forth above and other problems in the art.

BRIEF SUMMARY OF THE DISCLOSURE

One aspect of the present disclosure provides a pixel structure. The pixel structure includes a plurality of pixel cells arranged into a plurality of rows. Each row includes a plurality of pixel-cell groups arranged in a line along the row direction, and each pixel-cell group includes a predetermined number of subpixels arranged along the row direction and with the predetermined number of different colors. The plurality of rows are arranged along the column direction. For any two neighboring rows, each subpixel in one row is divided into two secondary subpixels along the row direction, and each subpixel in the other row is divided into two secondary subpixels along the column direction. The boundary between two neighboring pixel cells in each odd-numbered row has an offset with respect to a nearest boundary between two neighboring pixel cells in an adjacent even-numbered row. The predetermined number of different colors of the predetermined number of subpixels in each pixel-cell group of the odd-numbered rows include a first color, a second color, and a third color, respectively along the row direction, and the three different colors of the predetermined number of subpixels in each pixel-cell group of the even-numbered rows are the second color, the third color, and the first color, respectively along the row direction.

Another aspect of the present disclosure provides a driving method for a display panel. The display panel includes a display structure having a plurality of pixel cells arranged into a plurality of rows. Each row includes a plurality of pixel-cell groups arranged in a line along the row direction, and each pixel-cell group includes a predetermined number of subpixels arranged along the row direction and with the predetermined number of different colors. The plurality of rows are arranged along the column direction. For any two neighboring rows, each subpixel in one row is divided into two secondary subpixels along the row direction, and each subpixel in the other row is divided into two secondary subpixels along the column direction. The boundary between two neighboring pixel cells in each odd-numbered row has an offset with respect to a nearest boundary between two neighboring pixel cells in an adjacent even-numbered row. The predetermined number of different colors of the predetermined number of subpixels in each pixel-cell group of the odd-numbered rows include a first color, a second color, and a third color, respectively along the row direction, and the three different colors of the predetermined number of subpixels in each pixel-cell group of the even-numbered rows are the second color, the third color, and the first color, respectively along the row direction. The driving method includes using any two adjacent subpixels in a same row as a pixel group and driving each pixel group of the display panel to emit light. When a pixel group is driven to emit light, a subpixel in a neighboring row along the column direction and having a color different from the colors of the two subpixels of the pixel group is borrowed to emit light.

Another aspect of the present disclosure provides a driving method for a display panel. The display panel includes a display structure having a plurality of pixel cells arranged into a plurality of rows. Each row includes a plurality of pixel-cell groups arranged in a line along the row direction, and each pixel-cell group includes a predetermined number of subpixels arranged along the row direction and with the predetermined number of different colors. The plurality of rows are arranged along the column direction. For any two neighboring rows, each subpixel in one row is divided into two secondary subpixels along the row direction, and each subpixel in the other row is divided into two secondary subpixels along the column direction. The boundary between two neighboring pixel cells in each odd-numbered row has an offset with respect to a nearest boundary between two neighboring pixel cells in an adjacent even-numbered row. The predetermined number of different colors of the predetermined number of subpixels in each pixel-cell group of the odd-numbered rows include a first color, a second color, and a third color, respectively along the row direction, and the three different colors of the predetermined number of subpixels in each pixel-cell group of the even-numbered rows are the second color, the third color, and the first color, respectively along the row direction. The driving method includes using any two adjacent secondary subpixels with different colors in each row having every subpixel divided into two secondary subpixels along the column direction as a pixel group and driving each pixel group of the display panel to emit light. When a pixel group is driven to emit light, a secondary subpixel in a neighboring row along the column direction and having a color different from the colors of the two secondary subpixels of the pixel group is borrowed to emit light.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
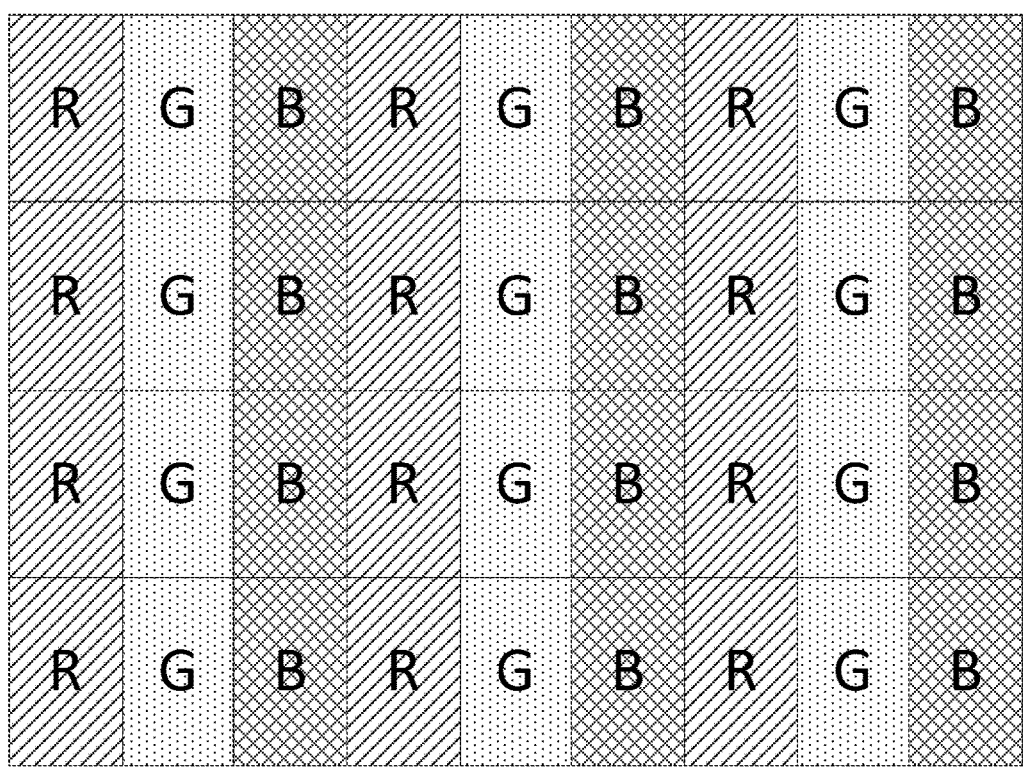
FIG. 1 illustrates a schematic view of a conventional pixel structure.

FIG. 1 illustrates a schematic view of a conventional pixel structure. Currently, the most common arrangement of pixels is a strip arrangement illustrated by the pixel structure shown in FIG. 1. Referring to FIG. 1, the plurality of subpixels have three different colors, namely, red (R), green (G), and blue (B). The subpixels in each color are arranged into a plurality of strips. That is, the R subpixels, the G subpixels, and the B subpixels are arranged into a plurality of R strips, a plurality of G strips, and a plurality of B strips, respectively. Moreover, for any three consecutive strips along a direction perpendicular to the strips, the colors of the three strips are different from each other. The strip arrangement of the pixels shown in FIG. 1 is known as the RGB pixel arrangement structure. However, the traditional RGB pixel arrangement structure may not meet the requirements of electronic devices on high-resolution displays.

Figure 2:
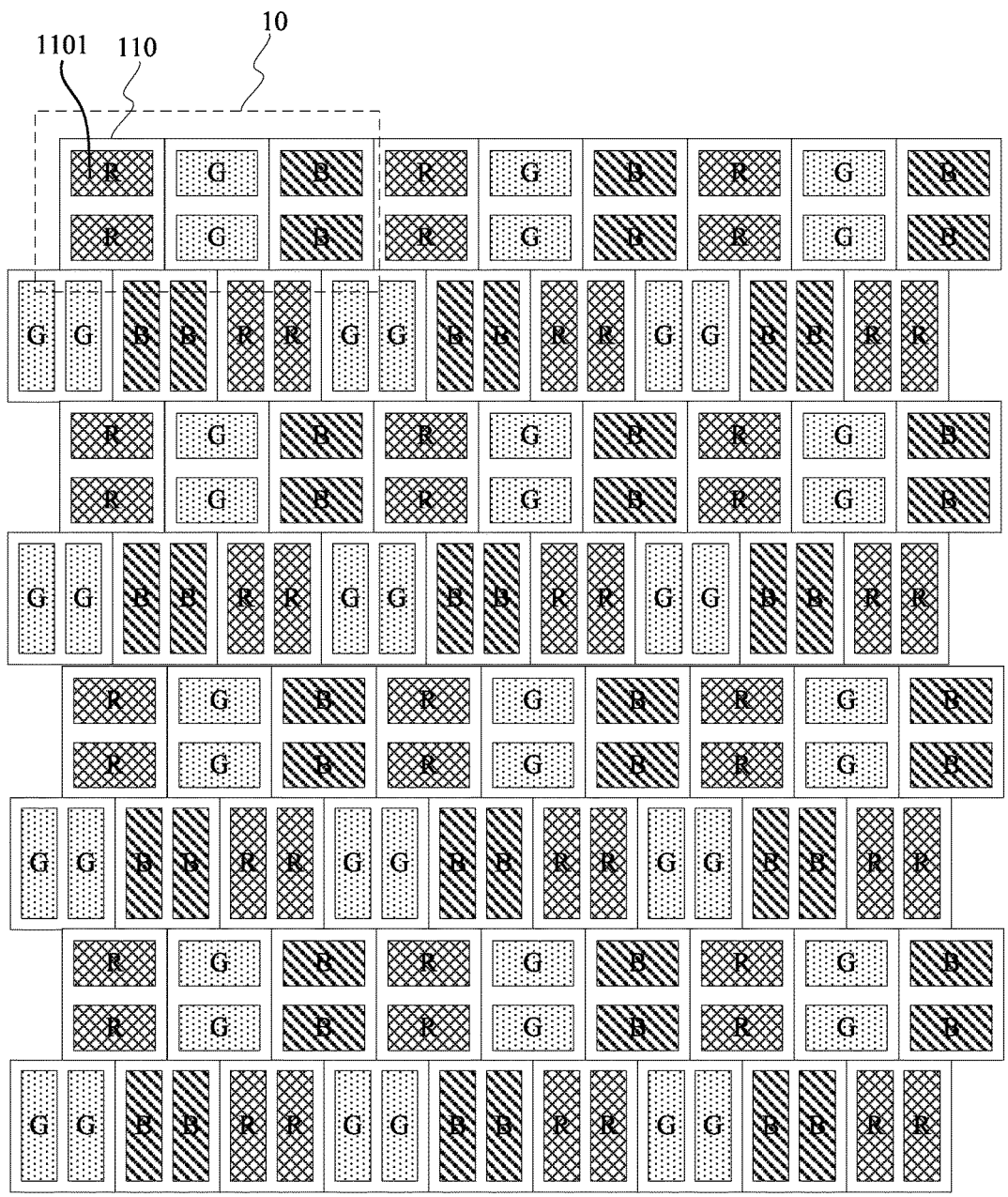
FIG. 2 illustrates a schematic view of an exemplary pixel structure consistent with some embodiments of the present disclosure.

The present disclosure provides a pixel structure. FIG. 2 illustrates a schematic view of an exemplary pixel structure consistent with some embodiments of the present disclosure, and FIG. 3 illustrates a schematic view of two pixel-cell groups in the exemplary pixel structure.

Figure 3:
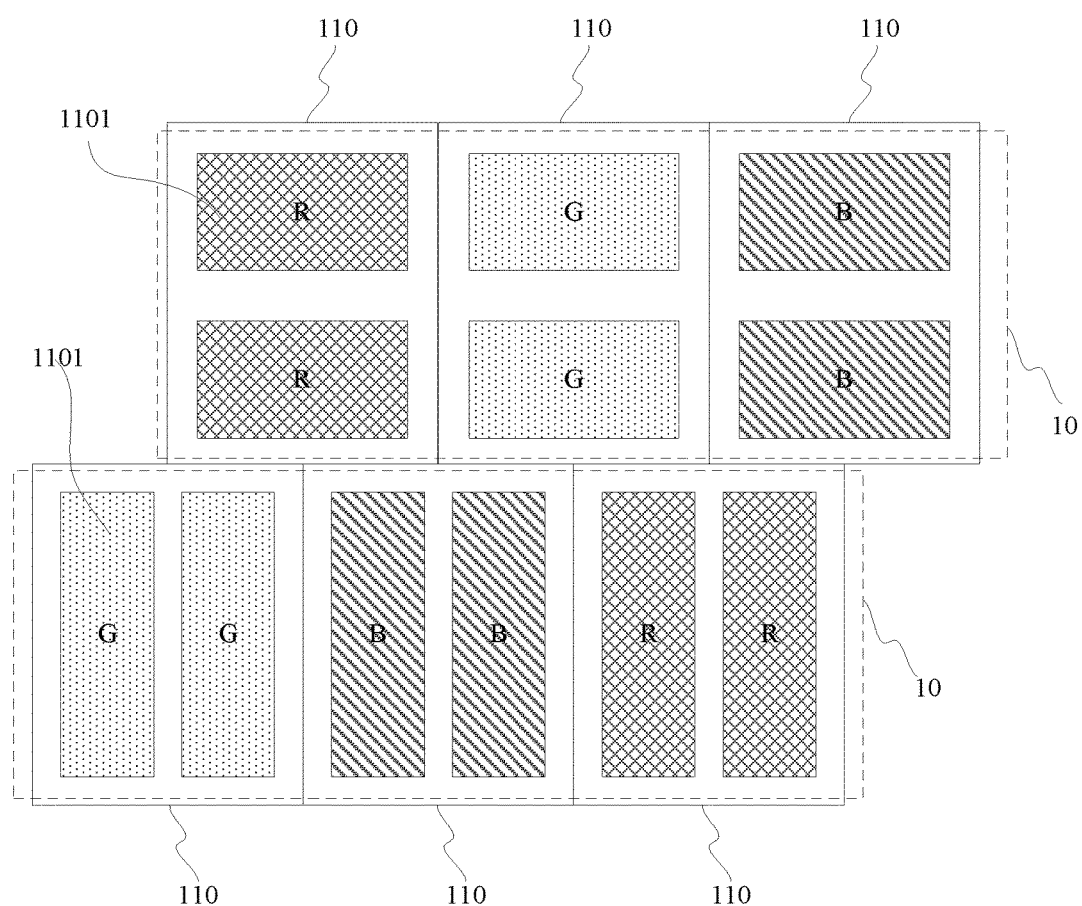
FIG. 3 illustrates a schematic view of two pixel-cell groups in an exemplary pixel structure consistent with some embodiments of the present disclosure.

Referring to FIG. 2 and FIG. 3, the pixel structure may include a plurality of the pixel cells and the plurality of pixel cells may be arranged into a plurality of rows. Each row of the pixel structure may include a plurality of pixel-cell groups 10 arranged in a line along the row direction. In addition, each pixel-cell group 10 may further include three subpixels 110 arranged along the row direction, and the three subpixels 110 may have three different colors, respectively. In one embodiment, the aforementioned pixel cell may refer to a subpixel 110, and thus each pixel-cell group 10 may include three pixel cells. In other embodiments, a pixel cell may refer to a pixel-cell group 10.

Further, the plurality of rows may be parallel to each other and the direction perpendicular to the row direction may be a column direction. Moreover, along the column direction, the plurality of rows may be arranged in a zigzag or staggered manner. For example, the odd-numbered rows may have an offset along the row direction with respect to the even-numbered rows. That is, the boundary between two neighboring pixel cells in an odd-numbered row may have an offset along the row direction with respect to the closest boundary between two neighboring pixel cells in an adjacent even-numbered row. For any two adjacent rows, each subpixel 110 in one row may be divided into two secondary subpixels 1101 along the row direction, and each subpixel 110 in the other row may be divided into two secondary subpixels 1101 along the column direction.

For the odd-numbered rows, the colors of the three subpixels 110 in each pixel-cell group 10 along the row direction may be a first color, a second color, and a third color, respectively. For the even-numbered rows, the colors of the three subpixels 110 in each pixel-cell group 10 along the row direction may be the second color, the third color, and the first color, respectively. Therefore, the colors of any two adjacent subpixels 110 may be different from each other.

According to the disclosed pixel structure, each row of the pixel cells includes a plurality of pixel-cell groups arranged in a line along the row direction, and each pixel-cell group further includes three subpixels arranged along the row direction and having three different colors. Moreover, for any two adjacent rows, each subpixel in one row may be divided into two secondary subpixels along the row direction, and each subpixel in the other row may be divided into two secondary subpixels along the column direction. The plurality of rows are arranged in a zigzag or staggered manner along the column direction with the odd-numbered rows having an offset along the row direction with respect to the even-numbered rows. In addition, the colors of any two adjacent subpixels are different from each other. As such, through secondary subpixel borrowing between adjacent subpixels, display with a resolution higher than the physical pixel arrangement may be achieved.

Because R, G, and B are the three primary colors, in one embodiment, each of the three colors of the subpixels, i.e., the first color, the second color, and the third color, may be a color selected from R, G, and B. In other embodiments, one or more of the first color, the second color, and the third color may not be selected from R, G, and B. For illustrative purposes, in one embodiment, the pixel structure is described to have R, G, and B as the three colors of the subpixels.

In one embodiment, according to the disclosed pixel structure, each subpixel in the odd-numbered rows may be divided into two secondary subpixels along the row direction, and each subpixel in the even-numbered rows may be divided into two secondary subpixels along the column direction. Alternatively, in other embodiments, each subpixel in the even-numbered rows may be divided into two secondary subpixels along the row direction, and each subpixel in the odd-numbered rows may be divided into two secondary subpixels along the column direction. For illustrative purposes, in one embodiment, the pixel structures are described to have each subpixel in the odd-numbered rows divided into two secondary subpixels along the row direction and each subpixel in the even-numbered rows divided into two secondary subpixels along the column direction.

In one embodiment, the pixel cells in the odd-numbered rows and the pixel cells in the even-numbered rows are arranged in a zigzag or staggered manner along the row direction. For any two adjacent rows, the corresponding subpixels in the two rows may have an offset with respect to each other along the row direction. For example, referring to FIG. 3, the $n^{th}$ subpixel 110 in the pixel cells of the first row is shifted by a half subpixel 110, equivalent to a secondary subpixel 1101 in the second row, away from the $n^{th}$ subpixel 110 in the pixel cells of the second row.

In one embodiment, as shown in FIG. 2 and FIG. 3, the two secondary subpixels 1101 in each subpixel 110 may have an identical area size. Moreover, because the area sizes of the two secondary subpixels 1101 in a subpixel 110 are the same, when the two secondary subpixels 1101 are separately borrowed by different sets of secondary subpixels 1101 through secondary subpixel borrowing, the identical area size of the two secondary subpixels 1101 may allow a same brightness of the emitted lights and thus ensure a uniform display brightness.

In another embodiment, the two secondary subpixels 1101 in each subpixel 110 may have different area sizes.

In one embodiment, the secondary subpixels 1101 in different subpixels 110 may all have a same area size. Having all secondary subpixels 1101 an identical area size may ensure that the secondary subpixels 1101 are uniformly arranged. As such, the uniformity of the picture displayed by the display panel may be improved and the patterning process may be simplified.

In other embodiments, the area sizes of the secondary subpixels may be different for subpixels with different colors. For example, the light emission efficiency of the B subpixels is usually lower than the light emission efficiency of the R or the G subpixels. Therefore, in some other embodiments, the area size of each B subpixel may be formed larger than the area size of each R or G subpixel in order improve the display uniformity for different colors.

In one embodiment, as shown in FIG. 2 and FIG. 3, the two secondary subpixels 1101 of each subpixel 110 may be axisymmetric. Therefore, in addition to having an identical area size, the two secondary subpixels 1101 may also have an identical shape.

In one embodiment, as shown in FIG. 2 and FIG. 3, the shape of the secondary subpixel 1101 may be a polygon with the inner angles greater than or equal to 90°. For example, the shape of the secondary subpixel 1101 may be quadrilateral, pentagonal, or hexagonal. Having the inner angles of the secondary subpixel 1101 greater than or equal to 90° may be able to reduce serrate edge, granular texture, and other undesired phenomena.

In one embodiment, as shown in FIG. 2 and FIG. 3, the secondary subpixel 1101 has a rectangular shape. Moreover, the rectangular shape may be completely consistent with the geometric definition of rectangle, or may be modified from a geometrically-defined rectangle in order to accommodate to the conditions of the existing process. For example, the shape of secondary subpixel 1101 may be a rectangle with curved edges and/or rounded angles.

Moreover, when the arrangement of the pixel structure is consistent with the disclosed pixel arrangement structure, each secondary subpixel 1101 may have any regular shape, or any irregular shape.

Figure 4:
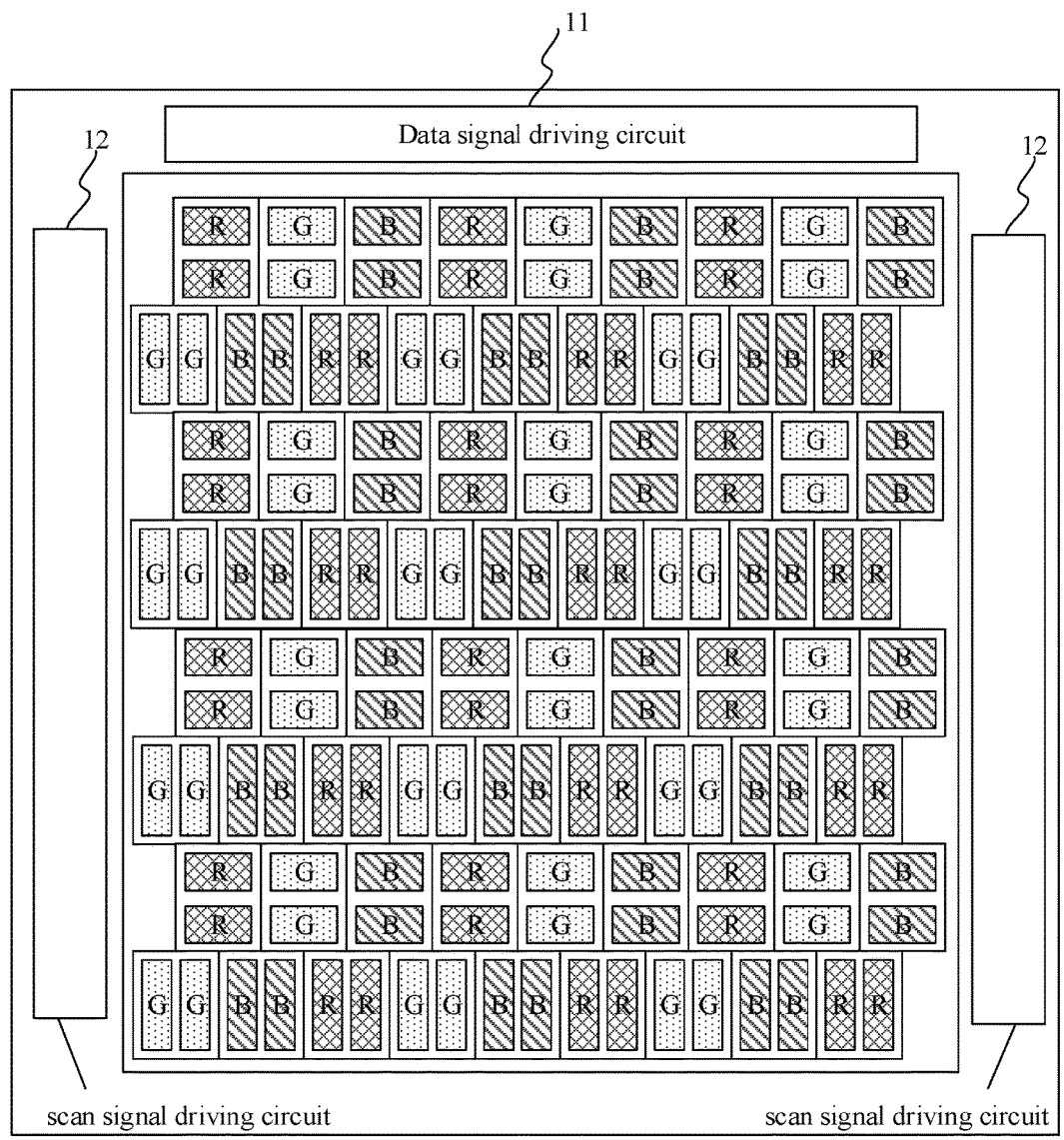
FIG. 4 illustrates a schematic view of an exemplary display panel consistent with some embodiments of the present disclosure.

The present disclosure also provides a display panel. FIG. 4 illustrates a schematic view of an exemplary display panel consistent with some embodiments of the present disclosure.

Referring to FIG. 4, the display panel may include a pixel structure consistent with any of the above embodiments of the present disclosure. In addition, the display panel may also include a plurality of pixel driving circuits (not shown) used to drive the plurality of secondary subpixels. Therefore, the pixel driving circuits may correspond to the plurality of second subpixels. For example, the display panel usually includes a data signal driving circuit 11 and a scan signal driving circuit 12 arranged on the frame region of the display panel. The data signal driving circuit 11 or the scan signal driving circuit 12 may be arranged at one location of the display panel or may be physically distributed to multiple locations of the display panel.

According to the disclosed display panels, each secondary subpixel may be connected to a corresponding pixel driving circuit. Further, the secondary subpixels may be used as the smallest units for pixel borrowing during display. As such, a high pixel-resolution may be achieved.

Figure 5:
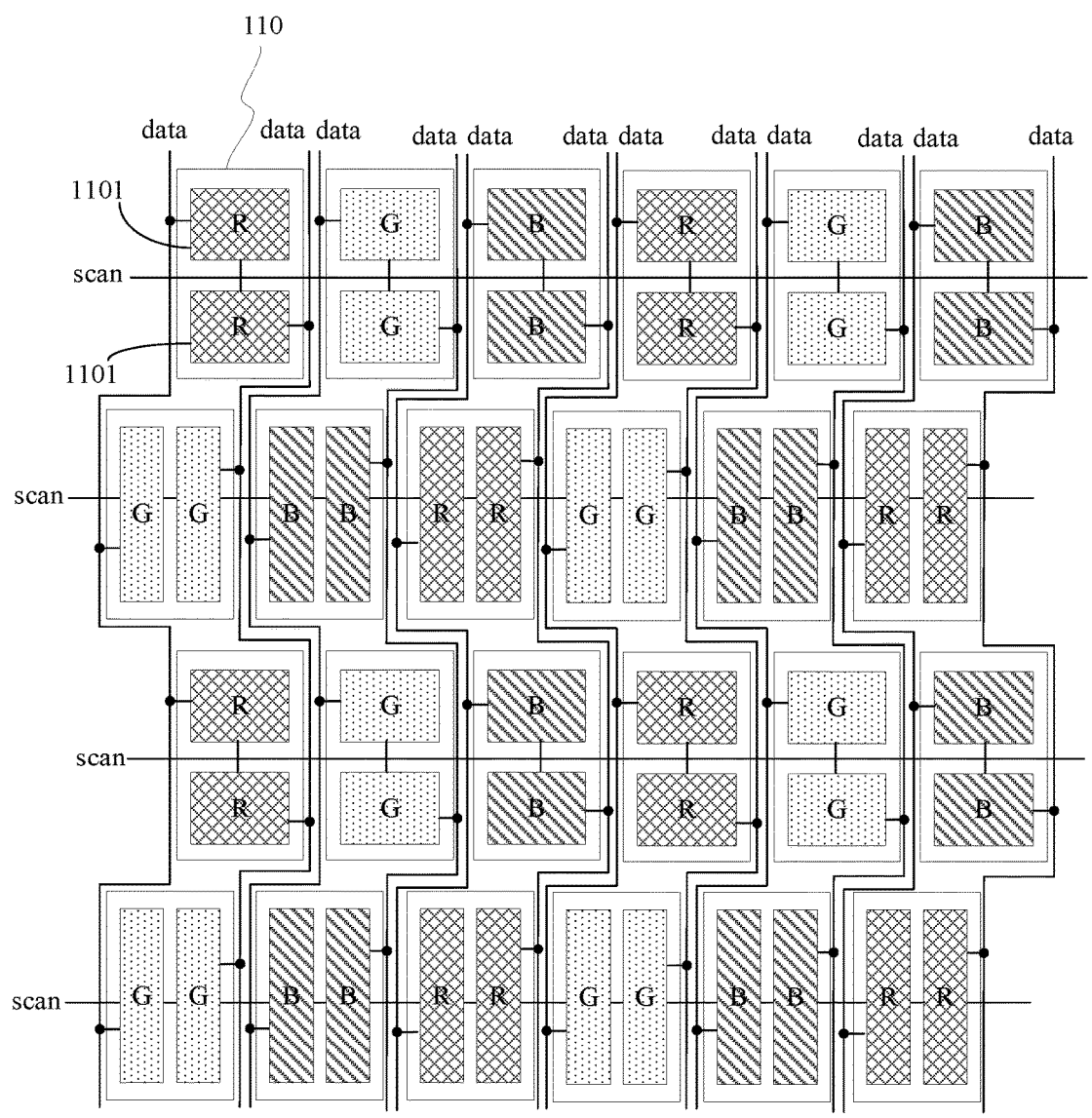
FIG. 5 illustrates a schematic view of another exemplary display panel consistent with some embodiments of the present disclosure.

FIG. 5 illustrates another exemplary display panel consistent with some embodiments of the present disclosure. Referring to FIG. 5, the display panel may also include a plurality of data lines connected to the plurality of secondary subpixels 1101, and a plurality of scan lines connected to the plurality of secondary subpixels 1101. The plurality of data lines and the plurality of scan lines may connect the plurality of secondary subpixels 1101 to the plurality of driving circuits. For example, the plurality of data lines may connect the plurality of secondary subpixels 1101 to a data signal driving circuit (referring to FIG. 4), and the plurality of scan lines may connect the plurality of secondary subpixels 1101 to a scan signal driving circuit (referring to FIG. 4).

The two secondary subpixels 1101 in each subpixel 110 may be connected to a same scan line, but may be connected to different data lines.

In one embodiment, as illustrated in FIG. 5, the subpixels in a same row may be connected to a single scan line. In other embodiments, the subpixels in a same row may be connected to two or more scan lines. Regardless of the number of scan lines that the subpixels in a same row are connected to, the scan line connected to a given subpixel may be connected to both secondary subpixels of the subpixel.

The disclosed display panel may be an organic light-emitting diode (OLED) display panel.

The present disclosure also provides a driving method corresponding to the display panel described above. In one embodiment, any two neighboring subpixels in a same row may be regarded as a pixel group, and the display-panel driving method may drive each pixel group to emit light. When the display-panel driving method drives a given pixel group to emit light, a subpixel in a neighboring row with a color different from the two colors of the two subpixels of the pixel group may be borrowed to emit light.

According to the disclosed display-panel driving method, subpixels are used as the smallest units, and any two neighboring subpixels in a same row are regarded as a pixel group. Further, when a pixel group is driven to emit light, a subpixel in a neighboring row with a color different from the two colors of the two subpixels of the pixel group may be borrowed to emit light. By using the emitted light of the three subpixels with different colors, any gray-scale brightness may be achieved.

Figure 6:
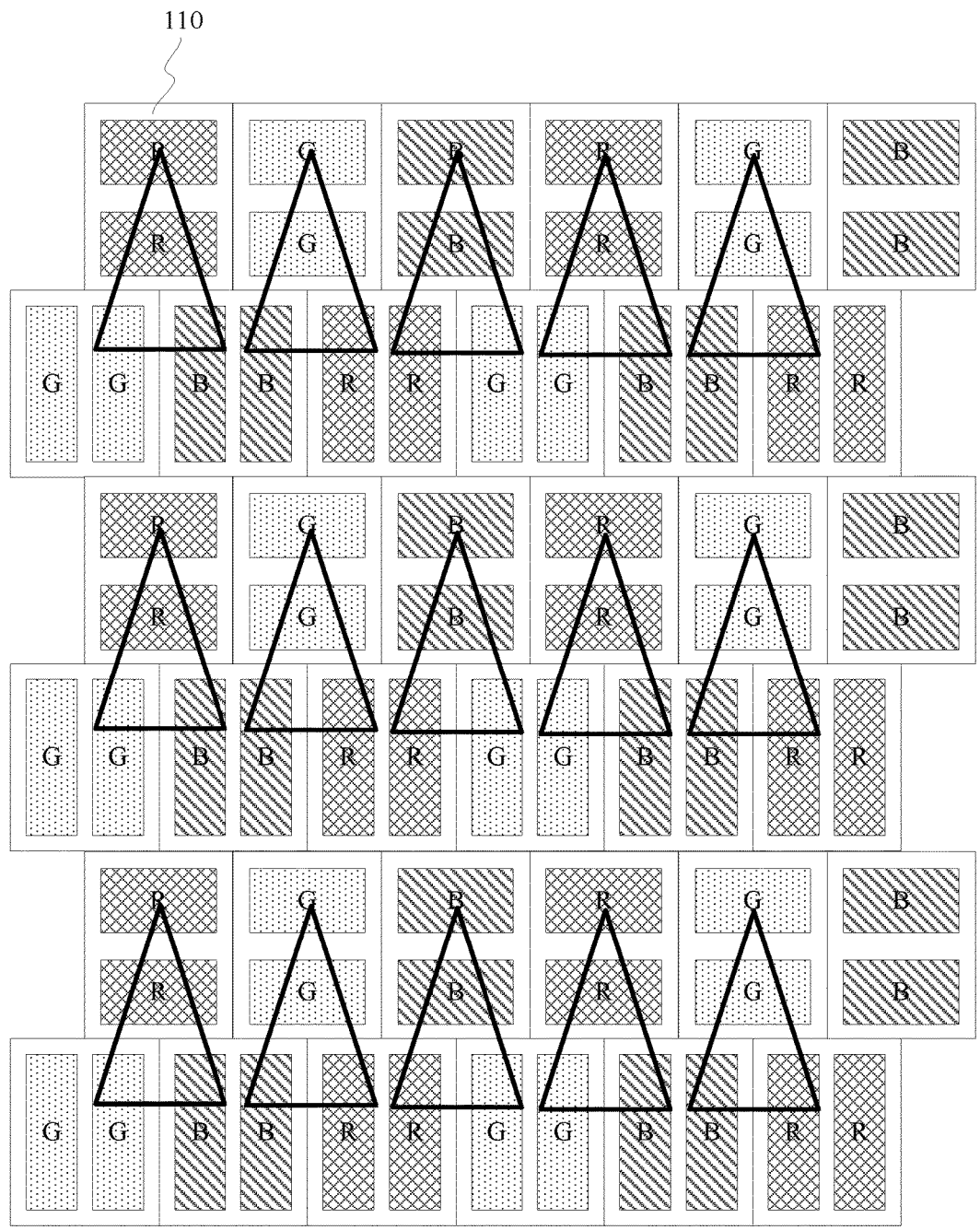
FIG. 6 illustrates a schematic diagram of subpixel borrowing according to an exemplary driving method of a display panel consistent with some embodiments of the present disclosure.

FIG. 6 illustrates a schematic diagram of subpixel borrowing according to an exemplary display-panel driving method consistent with some embodiments of the present disclosure. Referring to FIG. 6, any two adjacent subpixels 110 in each even-numbered row may be regarded as a pixel group, and the pixel group may borrow a subpixel in the row above to emit light. In the pixel structure shown in FIG. 6, three subpixels, i.e., RGB, may together form a pixel. Therefore, from the physical pixel arrangement point of view, FIG. 6 shows 12 pixels. However, according to the disclosed display-panel driving method, each triangle shown in FIG. 6 may represent a pixel, and thus the pixels shown in FIG. 6 may have a total number of 15. Therefore, by using the disclosed display-panel driving method, the resolution may be higher than the physical pixel arrangement of the display panel. In one embodiment, the display resolution according to the disclosed method may be nearly 3/2 times as that of the physical pixel arrangement.

Figure 7:
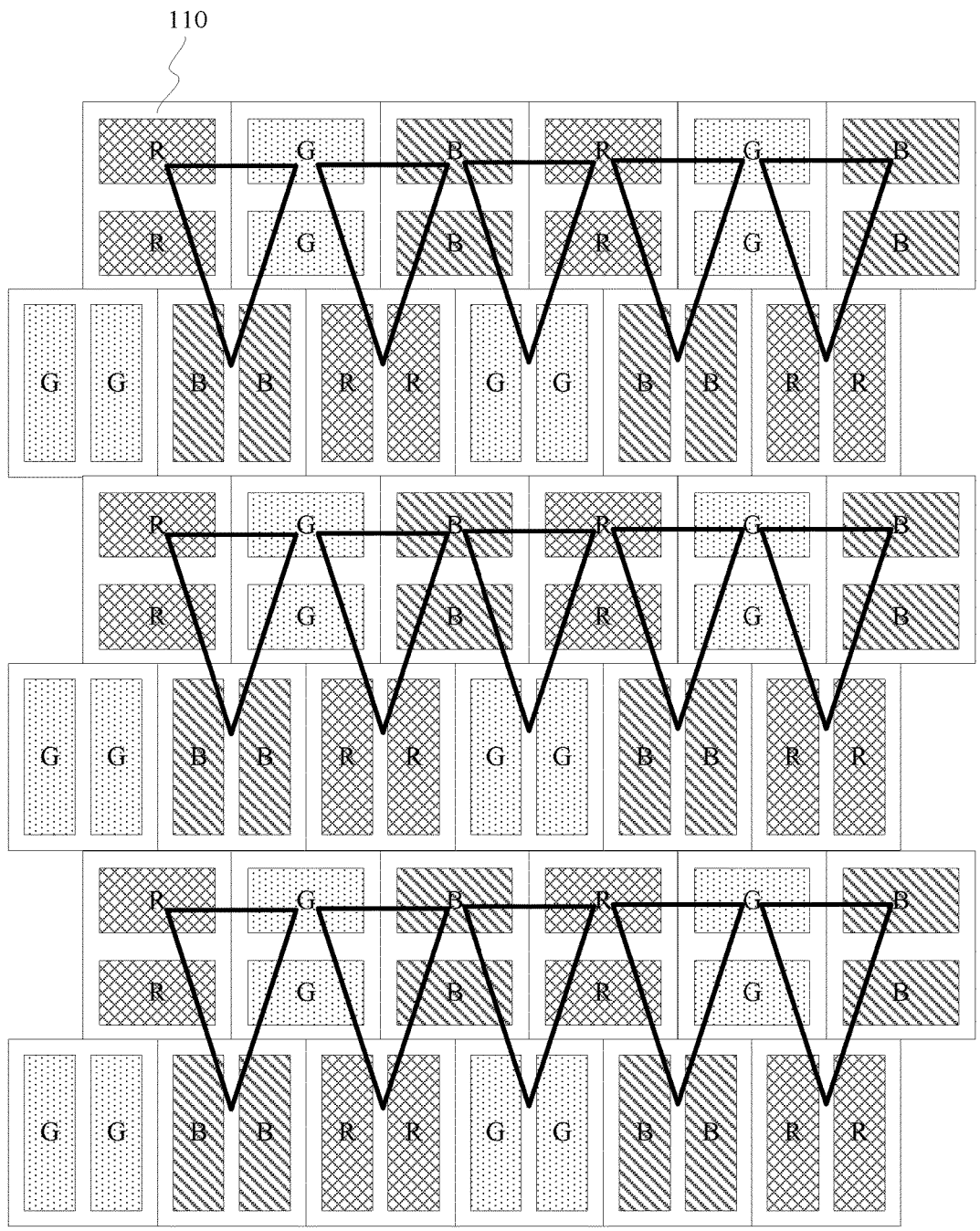
FIG. 7 illustrates a schematic diagram of subpixel borrowing according to another exemplary driving method of a display panel consistent with some embodiments of the present disclosure.

FIG. 7 illustrates a schematic diagram of subpixel borrowing according to another exemplary display-panel driving method consistent with some embodiments of the present disclosure. Referring to FIG. 7, any two adjacent subpixels 110 in each odd-numbered row may be regarded as a pixel group, and the pixel group may borrow a subpixel in the row below to emit light. Similar to FIG. 6, from the physical pixel arrangement point of view, FIG. 7 shows 12 pixels. However, according to the disclosed display-panel driving method, the pixels shown in FIG. 7 may have a total number of 15. Therefore, by using the disclosed display-panel driving method, the resolution may be higher than the physical pixel arrangement of the display panel. In one embodiment, the display resolution according to the disclosed method may be nearly 3/2 times as that of the physical pixel arrangement.

Figure 8:
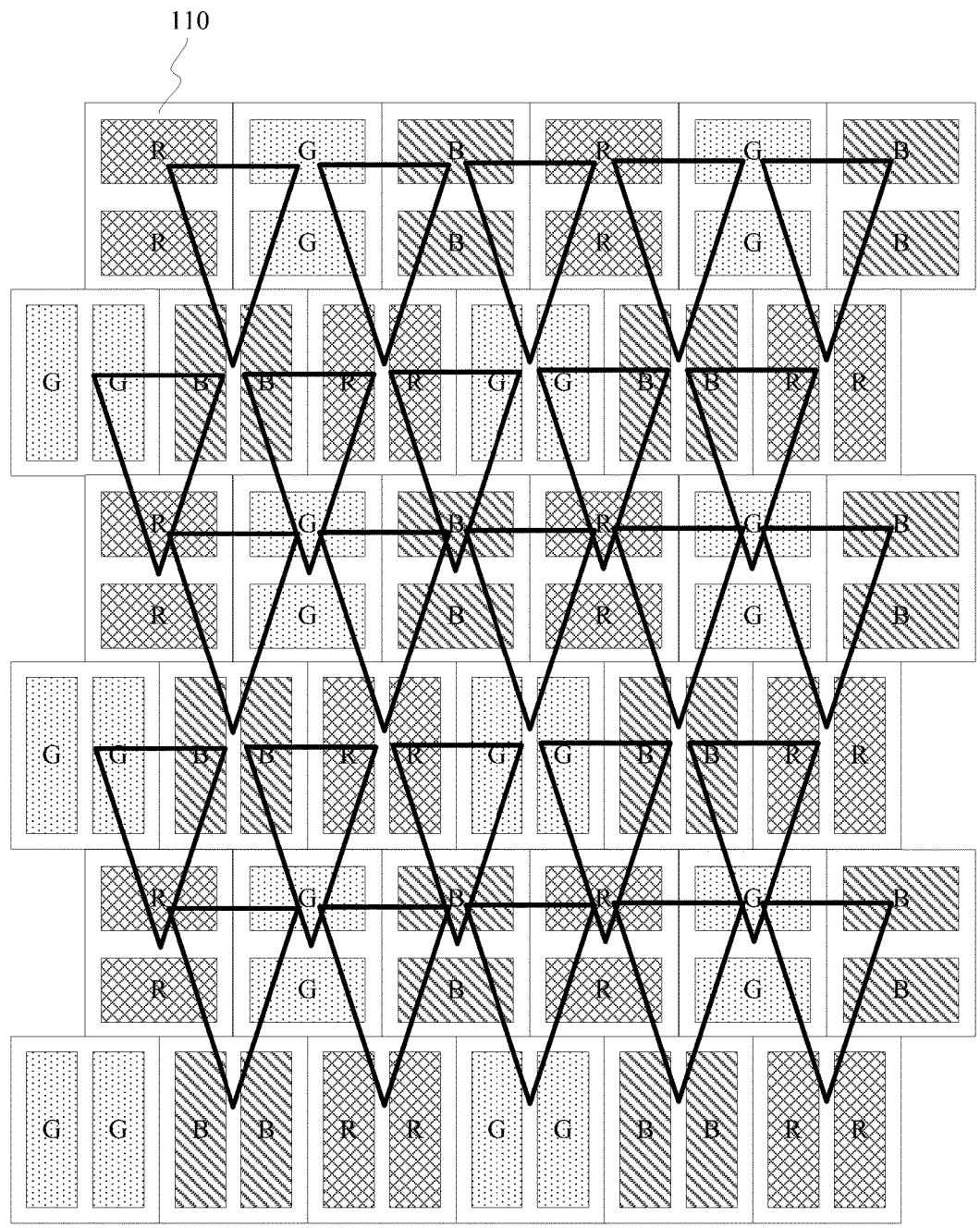
FIG. 8 illustrates a schematic diagram of subpixel borrowing according to another exemplary driving method of a display panel consistent with some embodiments of the present disclosure.

FIG. 8 illustrates a schematic diagram of subpixel borrowing according to another exemplary display-panel driving method consistent with some embodiments of the present disclosure. Referring to FIG. 8, any two adjacent subpixels 110 in a same row may be regarded as a pixel group, and the pixel group may borrow a subpixel in the row below to emit light. From the physical pixel arrangement point of view, FIG. 8 shows 12 pixels. However, according to the disclosed display-panel driving method, the pixels shown in FIG. 8 may have a total number of 25. Therefore, the display-panel driving method illustrated in FIG. 8 may be able to realize a display resolution even higher than the resolution according to the display-panel driving methods illustrated in FIG. 6 and FIG. 7.

Further, the disclosed display-panel driving method may use any order in which the plurality of rows of the pixel cells are driven. As long as for any two adjacent subpixels in a same row that are regarded as a pixel group, when the pixel group is driven to emit light, a subpixel in a neighboring row with a color different from the two colors of the two subpixels of the pixel group is borrowed to emit light, the corresponding driving method is consistent with the present disclosure.

In one embodiment, the gray-scale value Y corresponding to each subpixel may satisfy the following formula:

$$\begin{cases} Y = b \sum_{i=1}^{N} a_i X_i \\ 1 = \sum_{i=1}^{N} a_i \end{cases}$$

where N may represent the number of pixel groups that share the light emitted by the subpixel, b may represent the gray-scale brightness conversion factor, $X_i$ may represent the brightness of the emitted light of the subpixel required by the $i^{th}$ pixel group, and $a_i$ may represent the weight factor for the brightness of the emitted light of the subpixel required by the $i^{th}$ pixel group.

Figure 9:
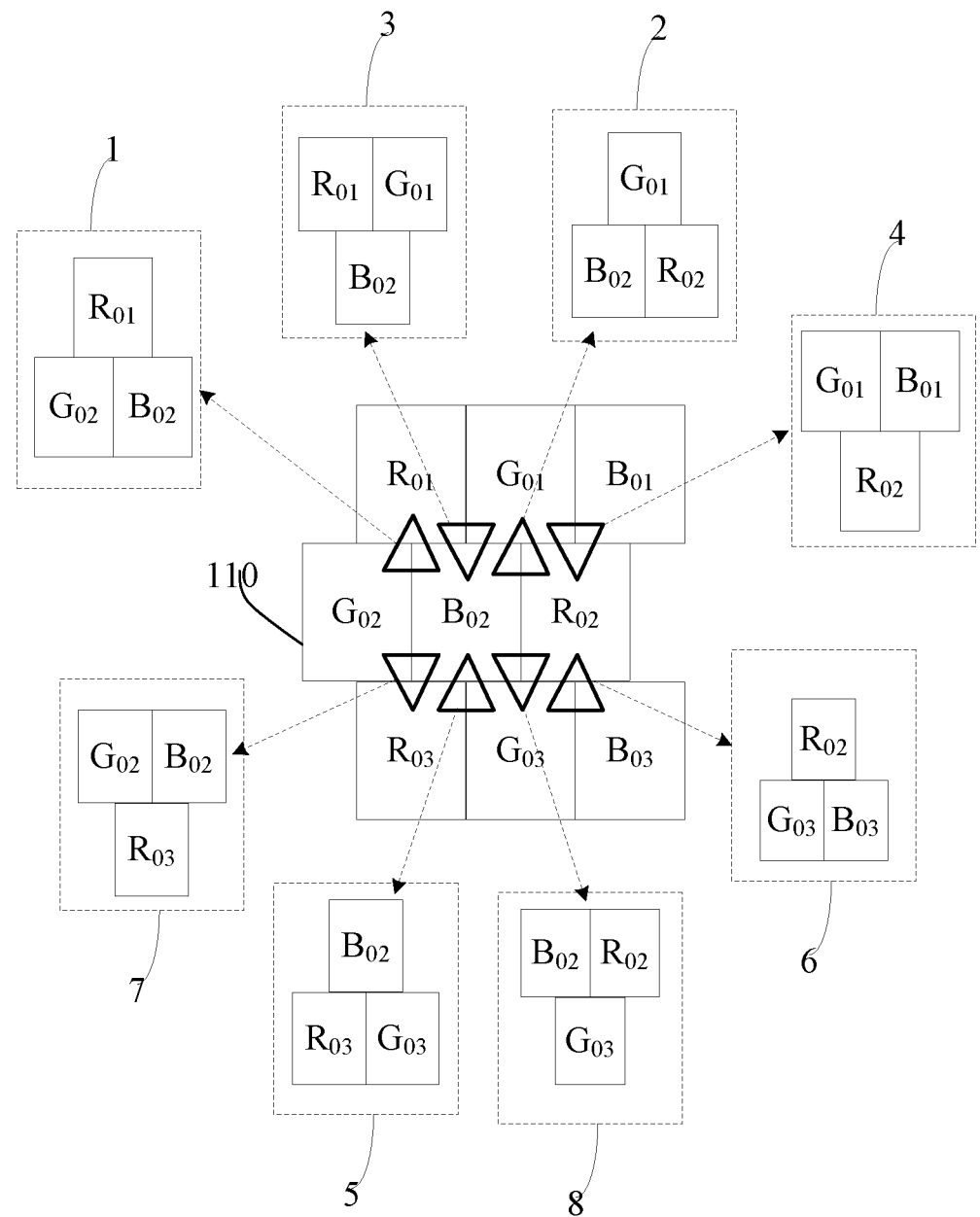
FIG. 9 illustrates a schematic diagram of subpixel borrowing for three pixel-cell groups according to an exemplary driving method of a display panel consistent with some embodiments of the present disclosure.

FIG. 9 illustrates a schematic diagram of subpixel borrowing for three pixel-cell groups according to an exemplary display-panel driving method consistent with some embodiments of the present disclosure. Referring to FIG. 9, any two adjacent subpixels in a same row may be regarded as a pixel group, and the pixel group may borrow a subpixel in a neighboring row to emit light. Therefore, a total of 8 combinations are shown in FIG. 9.

Moreover, subpixel $R_{01}$ may contribute to combination 1 and combination 3. Therefore, the gray-scale value of subpixel $R_{01}$ may be given by $R_{01}=b*(a_1*R_{11}+a_2*R_{13})$, where $a_1+a_2=1$, $R_{11}$ represents the brightness that subpixel $R_{01}$ is required to contribute to combination 1, and $R_{13}$ represents the brightness that subpixel $R_{01}$ is required to contribute to combination 3.

Subpixel $G_{01}$ may contribute to combination 2, combination 3, and combination 4. Therefore, the gray-scale value of subpixel $G_{01}$ may be given by $G_{01}=b*(a_1*G_{12}+a_2*G_{13}+a_3*G_{14})$, where $a_1+a_2+a_3=1$, $G_{12}$ represents the brightness that subpixel $G_{01}$ is required to contribute to combination 2, $G_{13}$ represents the brightness that subpixel $G_{01}$ is required to contribute to combination 3, and $G_{14}$ represents the brightness that subpixel $G_{01}$ is required to contribute to combination 4.

Subpixel $B_{01}$ may contribute to combination 4. Therefore, the gray-scale value of subpixel $B_{01}$ may be given by $B_{01}=b*B_{14}$, where $B_{14}$ represents the brightness that subpixel $B_{01}$ is required to contribute to combination 4.

Subpixel $G_{02}$ may contribute to combination 1 and combination 7. Therefore, the gray-scale value of subpixel $G_{02}$ may be given by $G_{02}=b*(a_1*G_{21}+a_2*G_{27})$, where $a_1+a_2=1$, $G_{21}$ represents the brightness that subpixel $G_{02}$ is required to contribute to combination 1, and $G_{27}$ represents the brightness that subpixel $G_{02}$ is required to contribute to combination 7.

Subpixel $B_{02}$ may contribute to combination 1, combination 2, combination 3, combination 5, combination 7, and combination 8. Therefore, the gray-scale value of subpixel $B_{02}$ may be given by $B_{02}=b*(a_1*B_{21}+a_2*B_{22}+a_3*B_{23}+a_4*B_{25}+a_5*B_{27}+a_6*B_{28})$, where $a_1+a_2+a_3+a_4+a_5+a_6=1$, $B_{21}$ represents the brightness that subpixel $B_{02}$ is required to contribute to combination 1, $B_{22}$ represents the brightness that subpixel $B_{02}$ is required to contribute to combination 2, $B_{23}$ represents the brightness that subpixel $B_{02}$ is required to contribute to combination 3, $B_{25}$ represents the brightness that subpixel $B_{02}$ is required to contribute to combination 5, $B_{27}$ represents the brightness that subpixel $B_{02}$ is required to contribute to combination 7, and $B_{28}$ represents the brightness that subpixel $B_{02}$ is required to contribute to combination 8.

Subpixel $R_{02}$ may contribute to combination 2, combination 4, combination 6, and combination 8. Therefore, the gray-scale value of subpixel $R_{02}$ may be given by $R_{02}=b*(a_1*R_{22}+a_2*R_{24}+a_3*R_{26}+a_4*R_{28})$, where $a_1+a_2+a_3+a_4=1$, $R_{22}$ represents the brightness that subpixel $R_{02}$ is required to contribute to combination 2, $R_{24}$ represents the brightness that subpixel $R_{02}$ is required to contribute to combination 4, $R_{26}$ represents the brightness that subpixel $R_{02}$ is required to contribute to combination 6, and $R_{28}$ represents the brightness that subpixel $B_{02}$ is required to contribute to combination 8.

Subpixel $R_{03}$ may contribute to combination 5 and combination 7. Therefore, the gray-scale value of subpixel $R_{03}$ may be given by $R_{03}=b*(a_1*R_{35}+a_2*R_{37})$, where $a_1+a_2=1$, $R_{35}$ represents the brightness that subpixel $R_{03}$ is required to contribute to combination 5, and $R_{37}$ represents the brightness that subpixel $R_{03}$ is required to contribute to combination 7.

Subpixel $G_{03}$ may contribute to combination 5, combination 6, and combination 8. Therefore, the gray-scale value of subpixel $G_{03}$ may be given by $G_{03}=b*(a_1*G_{35}+a_2*G_{36}+a_3*G_{38})$, where $a_1+a_2+a_3=1$, $G_{35}$ represents the brightness that subpixel $G_{03}$ is required to contribute to combination 5, $G_{36}$ represents the brightness that subpixel $G_{03}$ is required to contribute to combination 6, and $G_{38}$ represents the brightness that subpixel $G_{03}$ is required to contribute to combination 8.

Subpixel $B_{03}$ may contribute to combination 6. Therefore, the gray-scale value of subpixel $B_{03}$ may be given by $B_{03}=b*B_{36}$, where $B_{36}$ represents the brightness that subpixel $B_{01}$ is required to contribute to combination 6.

Figure 10:
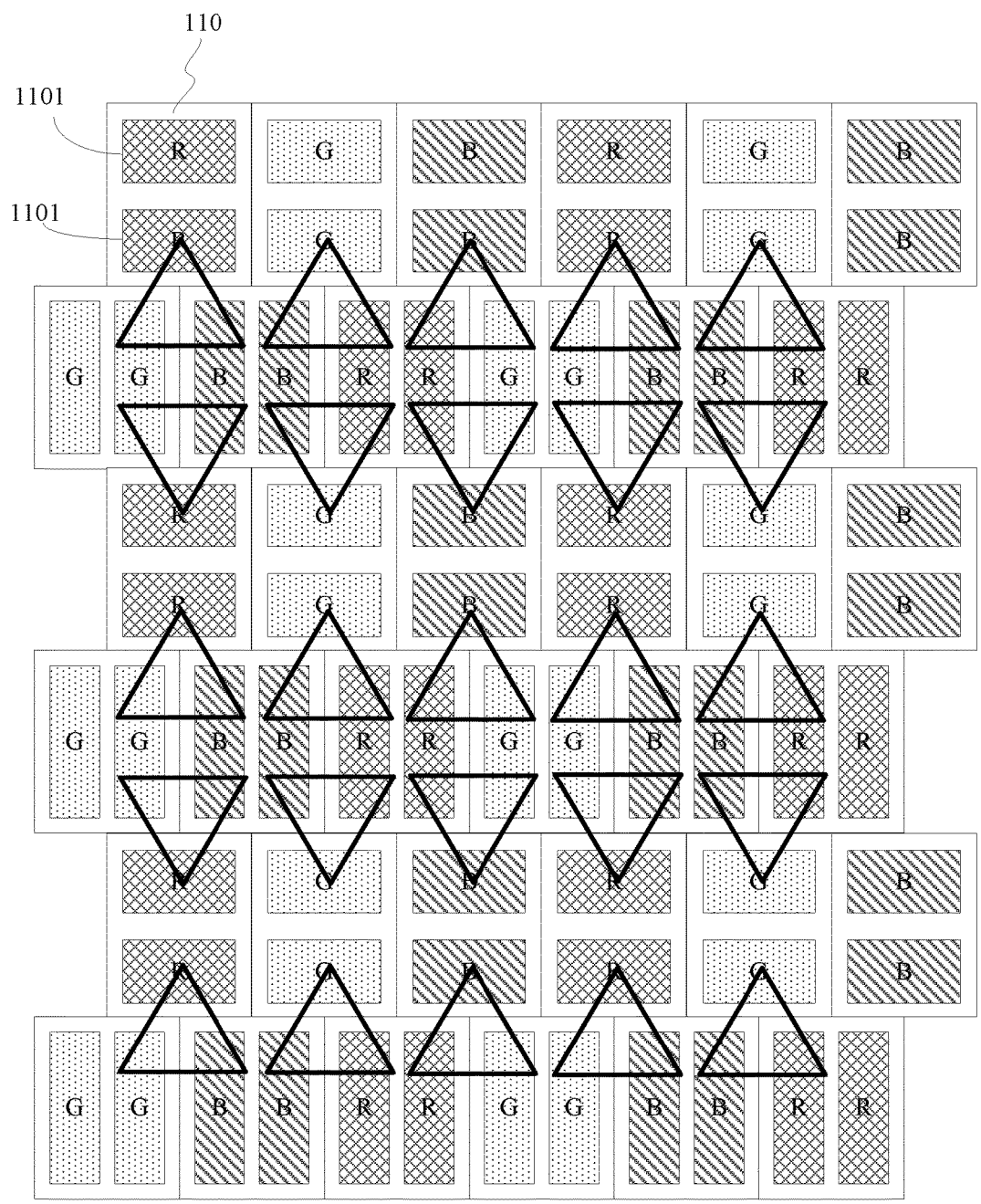
FIG. 10 illustrates a schematic diagram of secondary subpixel borrowing according to another exemplary driving method of a display panel consistent with some embodiments of the present disclosure.

Moreover, the present disclosure also provides another display-panel driving method. FIG. 10 illustrates a schematic diagram of secondary subpixel borrowing according to the exemplary driving method of a display panel consistent with some embodiments of the present disclosure.

Referring to FIG. 10, a display panel consistent with some embodiments of the present disclosure may be provided. The detailed pixel arrangement structure of the display panel may be referred to corresponding description provided above.

For each row of the pixel cells where every subpixel 110 is divided into two secondary subpixels 1101 along the column direction, any two adjacent secondary subpixels 1101 with different colors may be regarded as a pixel group. In one embodiment, the display-panel driving method may drive each pixel group of the display panel to emit light. When a given pixel group is driven to emit light, a secondary subpixel 1101 in a neighboring row with a color different from the colors of the two secondary subpixels 1101 of the pixel group may be borrowed to emit light.

According to the disclosed display-panel driving method, the secondary subpixels are used as the smallest units, and two neighboring secondary subpixels with different colors are regarded as a pixel group. Further, when a pixel group is driven to emit light, a secondary subpixel in a neighboring row with a color different from the two colors of the two secondary subpixels of the pixel group may be borrowed to emit light. By using the emitted light of the three secondary subpixels that have different colors, any gray-scale brightness may be achieved.

From the physical pixel arrangement point of view, the pixel structure shown in FIG. 10 includes 12 pixels. However, according to the disclosed display-panel driving method, each triangle shown in FIG. 10 may represent a pixel, and thus the pixels shown in FIG. 10 may have a total number of 25. Therefore, by using the disclosed display-panel driving method, the resolution may be higher than the physical pixel arrangement of the display panel. In one embodiment, the display resolution according to the disclosed method may be nearly 2 times as that of the physical pixel arrangement.

In one embodiment, the gray-scale value Y corresponding to each secondary subpixel may satisfy the following formula:

$$\begin{cases} Y = b\sum_{i=1}^{N} a_i X_i \\ 1 = \sum_{i=1}^{N} a_i \end{cases}$$

where N may represent the number of pixel groups that share the light emitted by the secondary subpixel, b may represent the gray-scale brightness conversion factor, $X_i$ may represent the brightness of the emitted light of the secondary subpixel required by the $i^{th}$ pixel group, and $a_i$ may represent the weight factor for the brightness of the emitted light of the secondary subpixel required by the $i^{th}$ pixel group.

Figure 11:
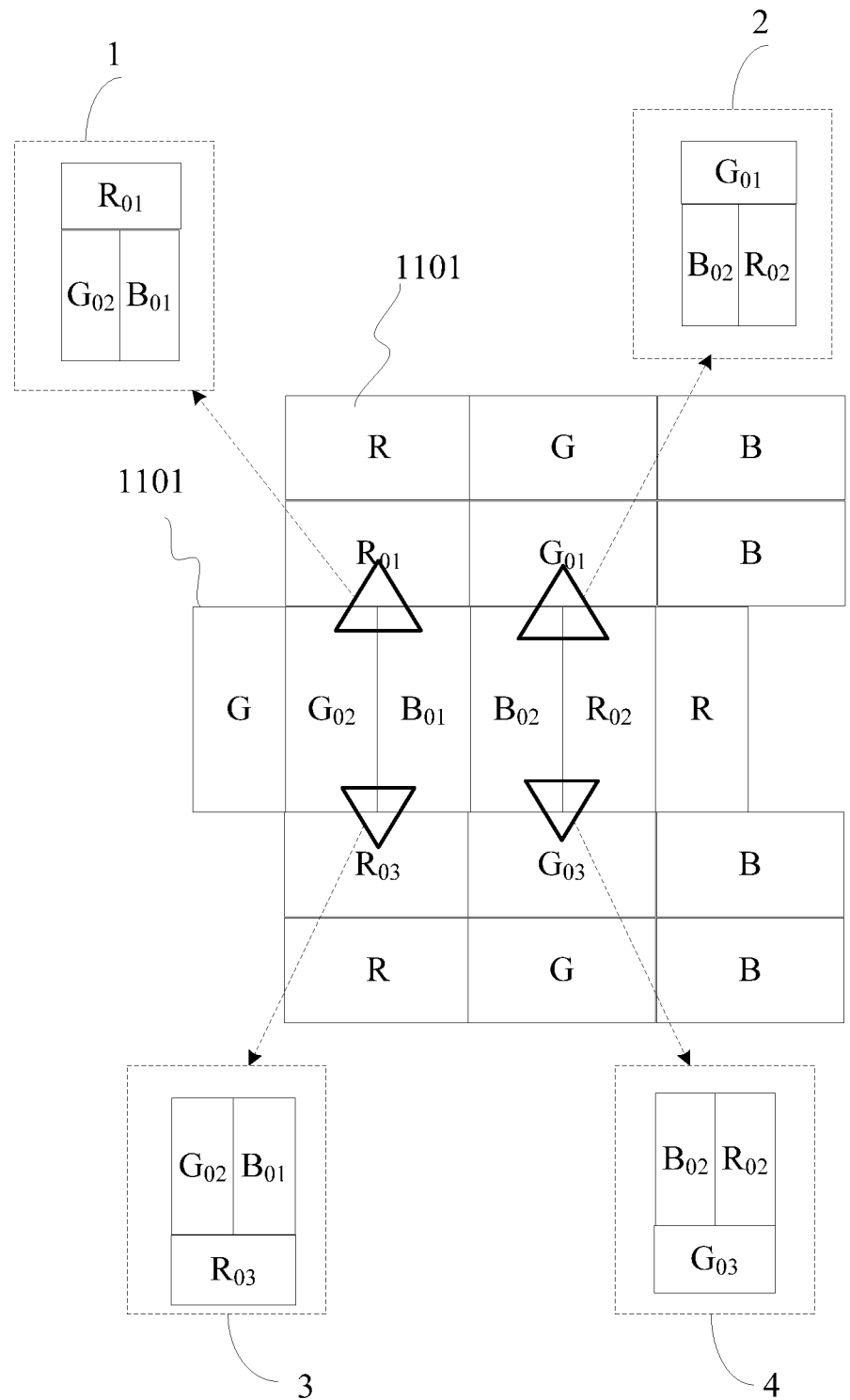
FIG. 11 illustrates a schematic diagram of secondary subpixel borrowing for three pixel-cell groups according to an exemplary driving method of a display panel consistent with some embodiments of the present disclosure.

FIG. 11 illustrates a schematic diagram of secondary subpixel borrowing for three pixel-cell groups according to an exemplary display-panel driving method consistent with some embodiments of the present disclosure. Referring to FIG. 11, any two adjacent secondary subpixels with different colors in the second row may be regarded as a pixel group, and the pixel group may borrow a secondary subpixel in a neighboring row to emit light. As such, a total of 4 combinations are shown in FIG. 11.

Moreover, subpixel $R_{01}$ may contribute to combination 1. Therefore, the gray-scale value of subpixel $R_{01}$ may be given by $R_{01}=b*R_{11}$, where $R_{11}$ represents the brightness that subpixel $R_{01}$ is required to contribute to combination 1.

Subpixel $G_{01}$ may contribute to combination 2. Therefore, the gray-scale value of subpixel $G_{01}$ may be given by $G_{01}=b*G_{12}$, where $G_{12}$ represents the brightness that subpixel $G_{01}$ is required to contribute to combination 1.

Subpixel $G_{02}$ may contribute to combination 1 and combination 3. Therefore, the gray-scale value of subpixel $G_{02}$ may be given by $G_{02}=b*(a_1*G_{21}+a_2*G_{23})$, where $a_1+a_2=1$, $G_{21}$ represents the brightness that subpixel $G_{02}$ is required to contribute to combination 1, and $G_{23}$ represents the brightness that subpixel $G_{02}$ is required to contribute to combination 3.

Subpixel $B_{01}$ may contribute to combination 1 and combination 3. Therefore, the gray-scale value of subpixel $B_{01}$ may be given by $B_{01}=b*(a_1*B_{11}+a_2*B_{13})$, where $a_1+a_2=1$, $B_{11}$ represents the brightness that subpixel $B_{01}$ is required to contribute to combination 1, and $B_{13}$ represents the brightness that subpixel $B_{01}$ is required to contribute to combination 3.

Subpixel $B_{02}$ may contribute to combination 2 and combination 4. Therefore, the gray-scale value of subpixel $B_{02}$ may be given by $B_{02}=b*(a_1*B_{22}+a_2*B_{24})$, where $a_1+a_2=1$, $B_{22}$ represents the brightness that subpixel $B_{02}$ is required to contribute to combination 2, and $B_{24}$ represents the brightness that subpixel $B_{02}$ is required to contribute to combination 4.

Subpixel $R_{02}$ may contribute to combination 2 and combination 4. Therefore, the gray-scale value of subpixel $R_{02}$ may be given by $R_{02}=b*(a_1*R_{22}+a_2*R_{24})$, where $a_1+a_2=1$, $R_{22}$ represents the brightness that subpixel $R_{02}$ is required to contribute to combination 2, and $R_{24}$ represents the brightness that subpixel $R_{02}$ is required to contribute to combination 4.

Subpixel $R_{03}$ may contribute to combination 3. Therefore, the gray-scale value of subpixel $R_{03}$ may be given by $R_{03}=b*R_{33}$, where $R_{33}$ represents the brightness that subpixel $R_{03}$ is required to contribute to combination 3.

Subpixel $G_{02}$ may contribute to combination 4. Therefore, the gray-scale value of subpixel $G_{02}$ may be given by $G_{03}=b*G_{34}$, where $G_{34}$ represents the brightness that subpixel $G_{03}$ is required to contribute to combination 4.

Figure 12:
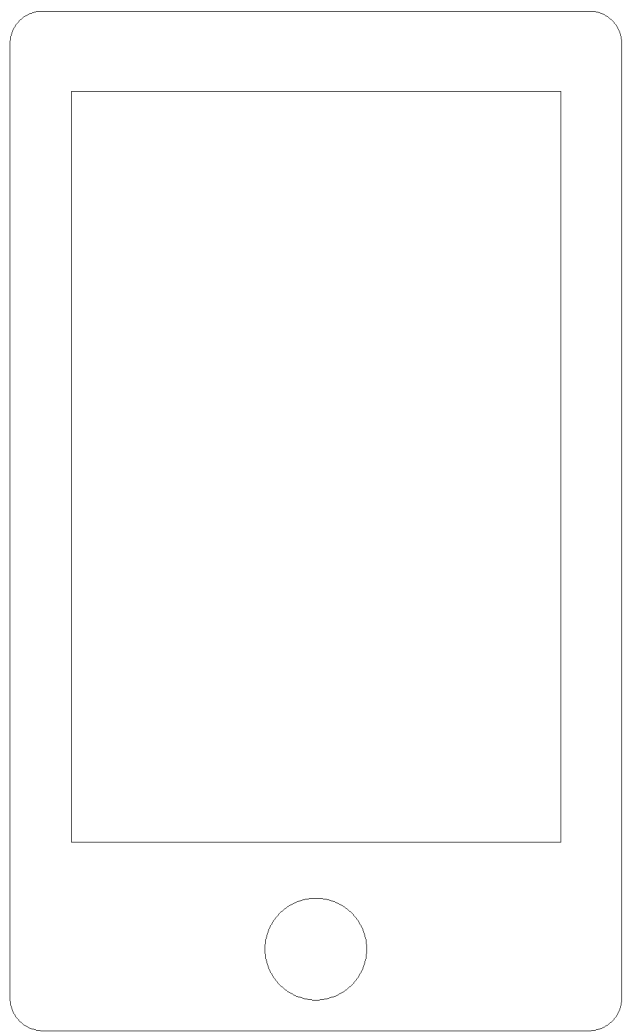
FIG. 12 illustrates a schematic view of an exemplary display device consistent with some embodiments of the present disclosure.

Further, the present disclosure also provides a display device including a display panel consistent with various embodiments of the present disclosure. FIG. 12 illustrates a schematic view of an exemplary display device consistent with some embodiments of the present disclosure.

Referring to FIG. 12, in one embodiment, the display device may be a cellphone including a display panel according to the present disclosure. In other embodiments, the disclosed device may be a tablet, a television, a monitor, a laptop computer, a digital camera, a navigation device, or any other product or component with a display function. The implementation of the display device may be referred to the above embodiments of the disclosed display panels.

According to the disclosed pixel structures, display panels, display devices, and display-panel driving methods, each row of pixel cells in a pixel structure includes a plurality of pixel-cell groups arranged in a line along the row direction, and each pixel-cell group further includes three subpixels arranged along the row direction and having three different colors. Moreover, for any two adjacent rows, each subpixel in one row may be divided into two secondary subpixels along the row direction, and each subpixel in the other row may be divided into two secondary subpixels along the column direction. The plurality of rows are arranged in a zigzag or staggered manner along the column direction with the odd-numbered rows having an offset along the row direction with respect to the even-numbered rows. In addition, the colors of any two adjacent subpixels are different from each other. As such, through secondary subpixel borrowing between adjacent subpixels, display with a resolution higher than the physical pixel arrangement may be achieved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A pixel structure, comprising:
 a plurality of pixel cells arranged into a plurality of rows, wherein:
   each row includes a plurality of pixel-cell groups arranged in a line along a row direction, wherein each pixel-cell group includes a predetermined number of subpixels arranged along the row direction and with the predetermined number of different colors;
   the plurality of rows are arranged along a column direction;
   for any two neighboring rows, each subpixel in one row is divided into two secondary subpixels along the row direction, and each subpixel in the other row is divided into two secondary subpixels along the column direction;
   a boundary between two neighboring pixel cells in each odd-numbered row has an offset with respect to a nearest boundary between two neighboring pixel cells in an adjacent even-numbered row; and
   the predetermined number of different colors of the predetermined number of subpixels in each pixel-cell group of the odd-numbered rows include a first color, a second color, and a third color, respectively along the row direction, and the three different colors of the predetermined number of subpixels in each pixel-cell group of the even-numbered rows are the second color, the third color, and the first color, respectively along the row direction.

2. The pixel structure according to claim 1, wherein:
 the predetermined number is three; and
 each of the first color, the second color, and the third color is one of red, green, and blue.

3. The pixel structure according to claim 1, wherein the two secondary subpixels in each subpixel have a same area size.

4. The pixel structure according to claim 3, wherein the secondary subpixels of the pixel structure have a same area size.

5. The pixel structure according to claim 4, wherein:
 the boundary between two neighboring pixel cells in each odd-numbered row has the offset equal to a half width of each subpixel with respect to the nearest boundary between two neighboring pixel cells in an adjacent even-numbered row.

6. The pixel structure according to claim 1, wherein the two secondary subpixels in each subpixel are axisymmetric.

7. The pixel structure according to claim 1, wherein a shape of the secondary subpixel is a polygon with each inner angle greater than or equal to 90°.

8. The pixel structure according to claim 7, wherein the shape of the secondary subpixel is a rectangle.

9. A display panel including a pixel structure according to claim 1, further comprising:
 a plurality of driving circuits connecting to the plurality of secondary subpixels.

10. The display panel according to claim 9, further including a plurality of data lines connected to each secondary subpixel and a plurality of scan lines connected to each secondary subpixel, wherein:
 the two secondary subpixels in each subpixel are connected to different data lines; and
 the two secondary subpixels in each subpixel are connected to a same scan line.

11. A display device including a display panel according to claim 9.

12. A driving method for a display panel including a pixel structure having a plurality of pixel cells arranged into a plurality of rows, wherein each row includes a plurality of pixel-cell groups arranged in a line along a row direction; each pixel-cell group includes a predetermined number of subpixels arranged along the row direction and with the predetermined number of different colors; the plurality of rows are arranged along a column direction; for any two neighboring rows, each subpixel in one row is divided into two secondary subpixels along the row direction, and each subpixel in the other row is divided into two secondary subpixels along the column direction; a boundary between two neighboring pixel cells in each odd-numbered row has an offset with respect to a nearest boundary between two neighboring pixel cells in an adjacent even-numbered row; and the predetermined number of different colors of the predetermined number of subpixels in each pixel-cell group of the odd-numbered rows include a first color, a second color, and a third color, respectively along the row direction, and the three different colors of the predetermined number of subpixels in each pixel-cell group of the even-numbered rows are the second color, the third color, and the first color, respectively along the row direction, comprising:

using any two adjacent subpixels in a same row as a pixel group; and driving each pixel group of the display panel to emit light, wherein:

when a pixel group is driven to emit light, a subpixel in a neighboring row along the column direction and having a color different from the colors of the two subpixels of the pixel group is borrowed to emit light.

13. The driving method according to claim 12, wherein: a gray-scale value Y corresponding to each subpixel satisfies a formula:

$$\begin{cases} Y = b \sum_{i=1}^{N} a_i X_i \\ 1 = \sum_{i=1}^{N} a_i \end{cases}$$

where N represents a number of pixel groups sharing emitted light of the subpixel, b represents a gray-scale brightness conversion factor, $X_i$ represents brightness of the emitted light of the subpixel required by an $i^{th}$ pixel group, and $a_i$ represents a weight factor for the brightness of the emitted light of the subpixel required by the $i^{th}$ pixel group.

14. A driving method for a display panel including a pixel structure having a plurality of pixel cells arranged into a plurality of rows, wherein each row includes a plurality of pixel-cell groups arranged in a line along a row direction; each pixel-cell group includes a predetermined number of subpixels arranged along the row direction and with the predetermined number of different colors; the plurality of rows are arranged along a column direction; for any two neighboring rows, each subpixel in one row is divided into two secondary subpixels along the row direction, and each subpixel in the other row is divided into two secondary subpixels along the column direction; a boundary between two neighboring pixel cells in each odd-numbered row has an offset with respect to a nearest boundary between two neighboring pixel cells in an adjacent even-numbered row; and the predetermined number of different colors of the predetermined number of subpixels in each pixel-cell group of the odd-numbered rows include a first color, a second color, and a third color, respectively along the row direction, and the three different colors of the predetermined number of subpixels in each pixel-cell group of the even-numbered rows are the second color, the third color, and the first color, respectively along the row direction, comprising:

using any two adjacent secondary subpixels with different colors in each row having every subpixel divided into two secondary subpixels along the column direction as a pixel group; and driving each pixel group of the display panel to emit light, wherein:

when a pixel group is driven to emit light, a secondary subpixel in a neighboring row along the column direction and having a color different from the colors of the two secondary subpixels of the pixel group is borrowed to emit light.

15. The driving method according to claim 14, wherein: a gray-scale value Y corresponding to each secondary subpixel satisfies a formula:

$$\begin{cases} Y = b \sum_{i=1}^{N} a_i X_i \\ 1 = \sum_{i=1}^{N} a_i \end{cases}$$

where N represents a number of pixel groups sharing emitted light of the secondary subpixel, b represents a gray-scale brightness conversion factor, $X_i$ represents brightness of the emitted light of the secondary subpixel required by an $i^{th}$ pixel group, and $a_i$ represents a weight factor for the brightness of the emitted light of the secondary subpixel required by the $i^{th}$ pixel group.

* * * * *